United States Patent
Fuyumuro et al.

(10) Patent No.: US 7,611,766 B2
(45) Date of Patent: Nov. 3, 2009

(54) WAFER PROTECTIVE SHEET

(75) Inventors: Masahiko Fuyumuro, Ashikaga (JP); Yoshitaka Nakayama, Ashikaga (JP); Eiichi Kawashima, Ashikaga (JP)

(73) Assignee: Achilles Corporation, Tokyo (JP)

( * ) Notice: Subject to any disclaimer, the term of this patent is extended or adjusted under 35 U.S.C. 154(b) by 745 days.

(21) Appl. No.: 10/550,960

(22) PCT Filed: Apr. 8, 2004

(86) PCT No.: PCT/JP2004/005084

§ 371 (c)(1),
(2), (4) Date: Sep. 28, 2005

(87) PCT Pub. No.: WO2004/089784

PCT Pub. Date: Oct. 21, 2004

(65) Prior Publication Data

US 2006/0237343 A1 Oct. 26, 2006

(30) Foreign Application Priority Data

Apr. 10, 2003 (JP) ............................. 2003-105958

(51) Int. Cl.
*B32B 1/00* (2006.01)
*B65D 85/00* (2006.01)
(52) U.S. Cl. ...................... 428/174; 428/66.5; 428/179; 211/41.18; 206/710
(58) Field of Classification Search ................ 428/64.1, 428/66.4, 66.5, 174, 180, 179; 206/454, 206/710; 118/500; 211/41.18
See application file for complete search history.

(56) References Cited

U.S. PATENT DOCUMENTS 3,911,187 A * 10/1975 Raley .......................... 428/180
6,286,684 B1 * 9/2001 Brooks et al. ............... 206/710

FOREIGN PATENT DOCUMENTS

| JP | A 9-129719 | 5/1997 |
| JP | A 2003-505875 | 2/2003 |

\* cited by examiner

*Primary Examiner*—Donald Loney
(74) *Attorney, Agent, or Firm*—Oliff & Berridge, PLC

(57) ABSTRACT

A wafer protective sheet 1 is made of a synthetic resin sheet with a thickness of 80 to 130 μm having a large number of projected parts and recessed parts on its front and rear surfaces. The large number of projected parts and the large number of recessed parts are respectively disposed so that each part is positioned at intersections of lattice stripes, and the projected part and the recessed part are disposed alternately each other. The sheet has such a water-like cross section that the recessed parts in the rear surface match the projected parts on the front surface and the projected parts on the rear surface match the recessed parts in the front surface. The wafer protective sheet 1 has a bending resistance of 30 to 80 mm. The wafer protective sheet 1 of the present invention is sufficiently thin. When the wafer protective sheets are interposed between stacked wafers to protect them, the sheets do not adhere to the wafers. Thus, wafers housed in a container can be protected against vibration during transportation.

7 Claims, 3 Drawing Sheets

WAFER PROTECTIVE SHEET

TECHNICAL FIELD

The present invention relates to a wafer protective sheet for protecting semiconductor wafers that are stacked on top of one another in a container.

BACKGROUND ART

A semiconductor wafer (hereinafter referred to as a wafer) is generally a thin disk cut out of a silicon single-crystal ingot, having a diameter of, for example, about 2 to 12 inches. The wafer is provided with many circuits, such as those for LSI's, on its surface and is then cut into chips. The chips are packaged, thus producing semiconductor devices, such as LSI's.

In the above process, the steps of cutting wafers out of the ingot, providing circuits on the wafers, and cutting the wafers into chips and packaging them are often performed in different places. For the transportation of the wafers from a place where one of the above-mentioned steps is carried out to another place, a special container of the wafers which is manufactured for such transportation is generally used.

For example, the wafers are stacked on top of one another and housed in the container. Unfortunately, the stacked wafers are liable to get scratched by their rubbing against each other. It is, accordingly, necessary to interpose wafer protective sheets made of, for example, polyethylene, between the wafers to prevent scratches.

Nowadays, in general, housing wafers in and taking them out of the container are performed by an automatic machine. For example, a pick-up arm having a vacuum suction portion is used for taking wafers out of a container. An optical sensor provided at the vicinity of the vacuum suction portion of the pick-up arm detects a position where wafers are placed and further distinguishes between the wafers and the protective sheets, and the pick-up arm thus transfers the wafers and the protective sheets to their respective places. In that case, since the front and rear surfaces of the wafer are mirror-finished, the wafer protective sheets are adhered to wafers which sometimes causes the automatic machine to be out of order. In order to prevent such a problem, an approach has been proposed in which the wafer protective sheet is provided with projected parts and recessed parts on its surface (refer to, for example, Japanese Patent Application Laid-open No. Hei 9-129719).

In a container in which wafers are housed, pressure is applied to the wafers in their thickness direction by providing cushioning material, etc. at the bottom and top of the inside of the container and covering the container, so that the wafers are prevented from being moved and thus damaged by vibration during transportation. In this instance, if the wafer protective sheets are hard, the projected parts and recessed parts of the protective sheets easily make scratches on the wafers. In order to prevent scratches, a flexible wafer protective sheet made of a nonwoven cloth has been proposed. However, fibers from such wafer protective sheets may negatively affect the wafers due to drop-out of fibers from the wafer protective sheet. It may be considered to arrange a wafer protective sheet to be laminated body and to form its surface by using a soft material. However, this results in high cost, disadvantageously.

Wafers must be free from dust or foreign matter and therefore, wafer protective sheets are hardly reused. In view of disposal, a wafer protective sheet is desired which has a thickness as thin as possible so as to produce few amount of waste.

Accordingly, an object of the present invention is to provide a wafer protective sheet a plurality of which are interposed between wafers stacked on top of one another so as to protect the wafers, which does not adhere to the wafers so as to be easily handled by an automatic machine, which can protect the wafers contained in a container from vibration during transportation, and which is made of a thin material from the viewpoint of disposal.

DISCLOSURE OF INVENTION

In order to accomplish the above object, the inventors of the present invention have conducted research for characteristics required of wafer protective sheets. As a result, the inventors found that a type of wafer protective sheet can prevent wafers from being scratched and that it does not adhere to wafers and is accordingly easy to be handled by an automatic machine. This type of wafer protective sheet has a large number of alternately arrayed projected parts and recessed parts, and has such an appropriate bending resistance as the wafer protective sheet turns flat or substantially flat with the projected parts and recessed parts pressed while a pressure is being applied to stacked wafers in a container in their thickness direction, and as the projected parts and recessed parts are restored to the original state when the container is uncovered to remove the pressure. The inventors also found that the wafer protective sheet can be made of a synthetic resin sheet having a bending resistance and satisfying characteristics required of the wafer protective sheet even if its thickness is reduced to 130 μm or less, preferably 110 μm or less. Thus, the present invention was accomplished.

The present invention is directed to a wafer protective sheet made of a synthetic resin sheet with a thickness of 80 to 130 μm having a large number of projected parts and a large number of recessed parts on the respective front surface and rear surfaces thereof. The large number of projected parts and the large number of recessed parts are respectively disposed in such a manner that each part is positioned at intersections of lattice stripes, and the projected part and the recessed part are disposed alternately each other. The sheet has such a wavy cross section that the recessed parts in the rear surface match the projected parts on the front surface and the projected parts on the rear surface match the recessed parts in the front surface. Also, the sheet has a bending resistance of 30 to 80 mm.

Since the wafer protective sheet of the present invention is made of a synthetic resin with a thickness of 80 to 130 μm whose bending resistance has been set at 30 to 80 mm by providing the projected parts and recessed parts, the wafer protective sheet has such a flexibility as projected parts and recessed parts turns flat or substantially flat when a pressure of, for example, $1 \times 10^3$ to $1 \times 10^4$ Pa, is applied to wafers in a container in the thickness direction of the wafers so that the wafers do not move. Thus, the possibility of making scratches on the wafers is reduced, and adhesion can be prevented effectively because the projected parts and recessed parts are restored to the original state when the container is opened.

In addition, in the wafer protective sheet of the present invention, the large number of projected parts and recessed parts are alternately arrayed in such a manner as to be positioned at intersections of lattice stripes. Consequently, the bending resistances in the lengthwise and crosswise directions of the wafer protective sheet are substantially the same; hence stiffness of the sheet has no orientation. Furthermore, since the projected parts are formed on both the front surface and the rear surface so that the resulting sheet has no distinction between the front surface and the rear surface, the wafer protective sheet can be more easily handled automatically.

BEST MODE FOR CARRYING OUT THE INVENTION

An embodiment of the present invention will now be described.

Figure 1:
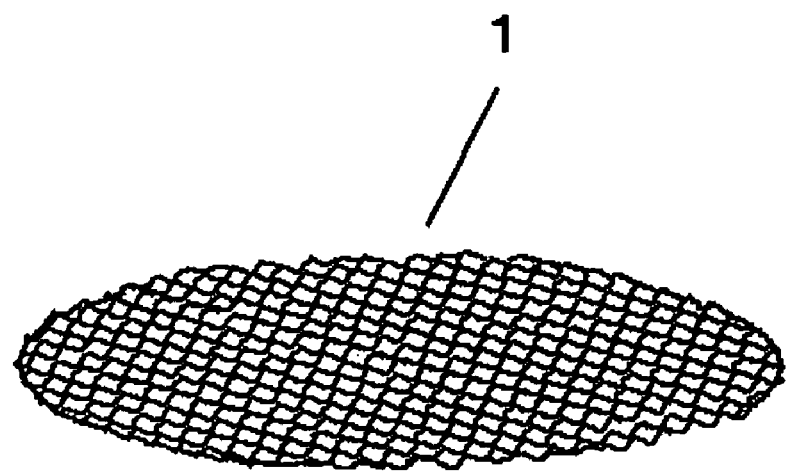
FIG. 1 is a perspective view of a wafer protective sheet according to the present invention.
Figure 2:
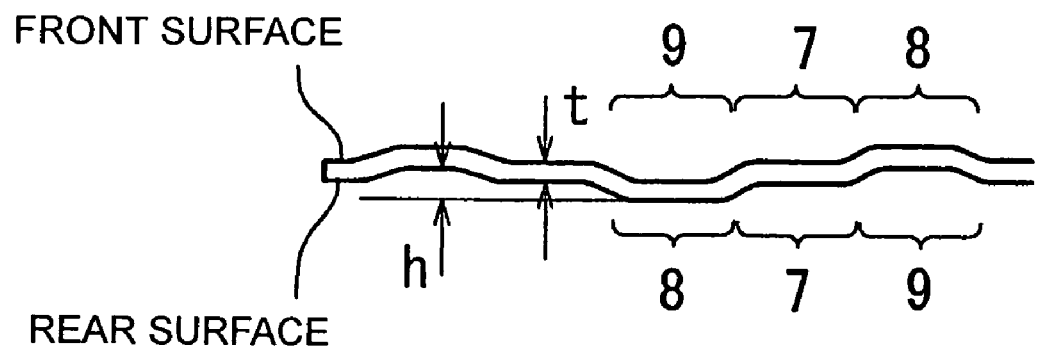
FIG. 2 is a fragmentary enlarged view of a wafer protective sheet according to the present invention.

A wafer protective sheet according to an embodiment of the present invention is a disk cut out of a sheet material having a large number of projected parts 8 and a large number of recessed parts 9 forming lattice stripes, as shown in FIGS. 1 and 2. The projected parts 8 and recessed parts 9 are disposed in such a matter as to be positioned at intersections of lattice stripes and alternately each other. The manner as to be positioned at intersections of lattice stripes means a manner that when a quadrangle is drawn by connecting four adjacent projected parts 8 with a line, the recessed part 9 is located in the quadrangle. The quadrangle is not necessarily square, and may be rectangular. The recess 9 does not necessarily lie at the center of the quadrangle.

The material of the wafer protective sheet 1 has a thickness t (see FIG. 2) of 80 to 130 μm, and preferably 80 to 110 μm. A sheet material with a thickness of less than 80 μm results in such a light wafer protective sheet 1 as to flutter, and consequently it becomes difficult to be handled by an automatic machine. Also, if the wafer protective sheet 1 has a thickness of less than 80 μm, the synthetic resin sheet needs to have a high hardness so that the resulting wafer protective sheet 1 does not droop when it is handled by an automatic machine. However, a high hardness of the sheet negatively affects the capability of protecting wafers 2 from scratches, and besides makes it difficult to form the recessed parts 8 and the projected parts 9 uniformly. On the other hand, a thickness of more than 130 μm not only increases the costs of materials of the wafer protective sheet 1, but is also disadvantageous in view of disposal (environment).

The height h of the projected parts and recessed parts, defined by the distance from the bottom of the recessed parts 9 to the top of the projected parts 8 (see FIG. 2) is preferably set in the range of 20 to 50 μm to prevent adhesion. A height of less than 20 μm cannot sufficiently prevent adhesion, and a height of more than 50 μm requires a larger space for storing the wafer protective sheet 1. The density of the projected parts and recessed parts is not particularly limited, but preferably, the number of projected parts and/or the number of recessed parts is 0.5 to 16 per square centimeter of sheet area of the wafer protective sheet (0.5 to 16/cm²). A density of less than 0.5 is likely to affect the capability of adhesion prevention, and a density of more than 16 may not enhance the adhesion prevention.

The area of a single projection or recess is preferably set at 0.3 to 3.0 mm² in plan view, from the viewpoint of ease of their formation by heat embossing. Furthermore, the projected parts and recessed parts must be smooth without sharp edges so as not to make scratches on wafers.

Figure 5:
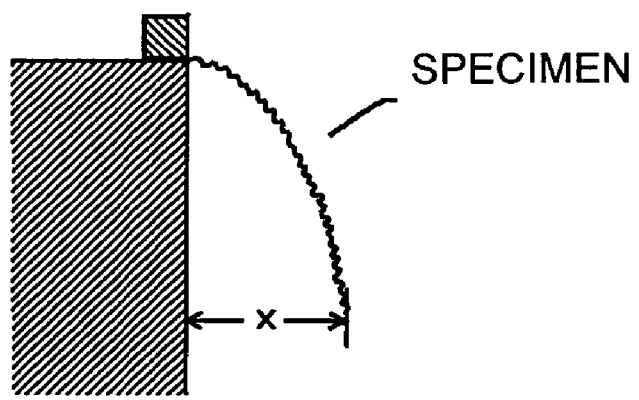
FIG. 5 is a schematic illustration of a method for measuring bending resistance.

The wafer protective sheet 1 has a bending resistance of 30 to 80 mm, and preferably 30 to 50 mm. In the present invention, the bending resistance is defined as the distance X in the horizontal direction of the bending formed when a specimen with a width of 15 mm protrudes in the horizontal direction at a length of 120 mm with its one end held as shown in FIG. 5. A wafer protective sheet with a bending resistance of less than 30 mm may droop or result in other problems when it is handled by an automatic machine. A wafer protective sheet with a bending resistance of more than 80 mm is likely to make scratches on wafers 2 due to vibration during transportation.

Figure 3:
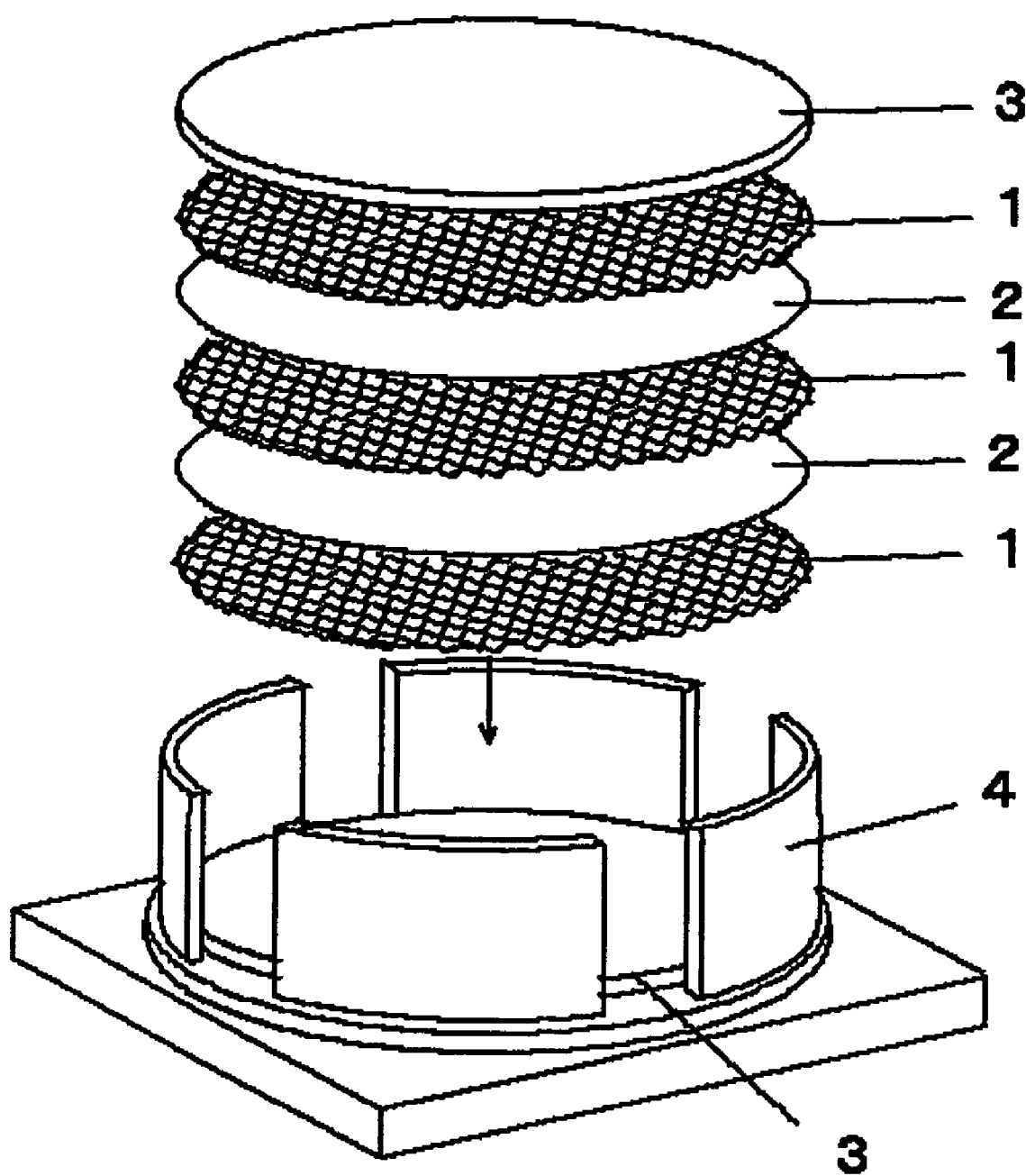
FIG. 3 is a perspective illustration showing how wafers are housed in a container.
Figure 4:
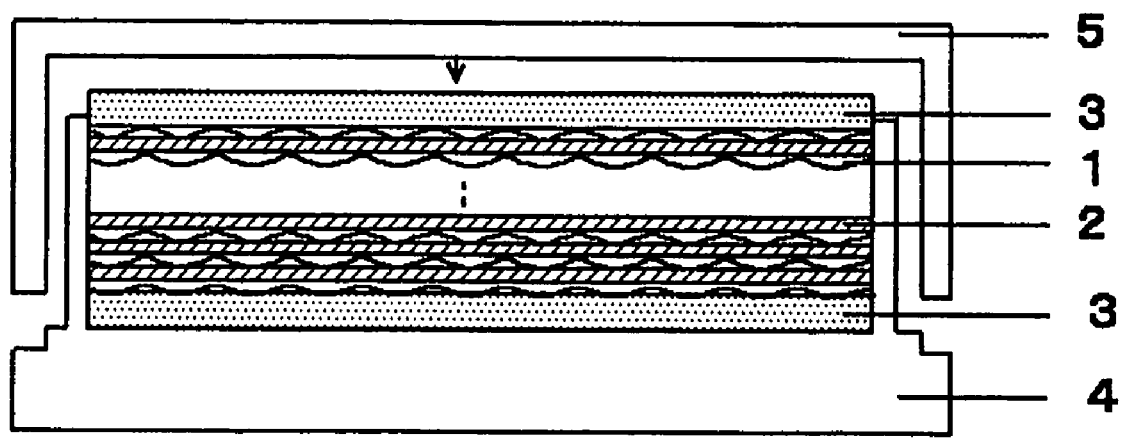
FIG. 4 is a sectional view of an example of wafers housed in a container.

For housing wafers 2 in a container 4, a cushion 3 is disposed on the bottom of the container 4, then the wafer protective sheets 1 and the wafers 2 are alternately stacked, and another cushion 3 is further disposed on the top of the stack, as shown in FIG. 3. Then, the container is closed with a cover 5, as shown in FIG. 4. When the cover 5 is put on the container 4, a pressure is applied so that the wafers 2 do not move.

The synthetic resin for forming the wafer protective sheet 1 of the present invention is such as to provide an appropriate bending resistance and appropriate flexibility to the wafer protective sheet 1. Preferably, a high-density polyethylene is used. An antistatic material or the like may be added to the synthetic resin if necessary, and a synthetic resin compound is thus prepared for the wafer protective sheet 1.

Alternatively, another resin having physical properties similar to the high-density polyethylene may be used, such as a mixture of polyethylene and polypropylene or an ethylene-propylene copolymer.

The antistatic material, which is intended to prevent dust or the like from landing on the wafer protective sheet 1 and to remove static electricity generated by friction between a wafer 2 and the wafer protective sheet 1 effectively, is kneaded to the synthetic resin typically in such an amount as the wafer protective sheet 1 has a surface resistivity of $10^{12}\Omega$ or less. Examples of the antistatic material include carbon black, graphite carbon, carbon fiber, metal powder, metal oxide powder, metal-coated materials, static-free ethylene copolymer ionomer resins using an alkali metal as an ion source, low-molecular-weight antistatic agents such as surfactants, and polymeric antistatic agents.

In order to give the wafer protective sheet 1 an antistatic property, the surfaces of the wafer protective sheet 1 can be coated with a material having an antistatic property. It is however disadvantageous because the coating material may separate to drop off the sheet, and because costs increase due to increase of processing steps. It is therefore preferable that the synthetic resin compound be prepared by kneading the antistatic material with the synthetic resin. The synthetic resin compound for preparing the wafer protective sheet 1 preferably has flexural modulus (JIS K6922-2) of $1.0 \times 10^3$ to $1.2 \times 10^3$ MPa. Such a material can easily achieve a wafer protective sheet having a bending resistance of 30 to 80 mm, preferably 30 to 50 mm, at a thickness of 80 to 130 μm, preferably 80 to 110 μm. In use of a synthetic resin compound having flexural modulus of less than $1.0 \times 10^3$ MPa, however, the sheet must be formed to a large thickness so that the resulting wafer protective sheet 1 has an appropriate bending resistance. This is disadvantageous in terms of disposal. A synthetic resin having flexural modulus of more than $1.2 \times 10^3$ MPa results in a sheet liable to make scratches on wafers. The flexural modulus, which is a physical property similar to tensile modulus (JIS K7161), is defined by flexural stress at a very low strain specified in JIS.

The wafer protective sheet 1 of the present invention is formed of the above-described synthetic resin compound.

First, a synthetic resin compound containing such an amount of antistatic material as achieves a surface resistivity of $10^{12}\Omega$ or less is extruded to form a synthetic resin sheet with a uniform thickness by extrusion method, etc. The thickness of the synthetic resin sheet is set at 80 to 130 μm, preferably 80 to 110 μm.

Then, the resulting synthetic resin sheet is subjected to heat embossing. Specifically, the synthetic resin sheet is heated until it is softened, and is fed to a pair of rolls having many protrusions at staggered positions. The projected parts 8 of the front surface, which correspond to recessed parts of the rear surface, are formed at positions of the synthetic resin sheet where the protrusions press in the direction from the rear surface to the front surface. Also, the recessed parts 9 of the front surface, which correspond to protrusions of the rear surface, are formed at positions of the synthetic resin where the protrusions press in the direction from the front surface to the rear surface.

The wafer protective sheet 1 may have flat parts 7, which have not been deformed, between the projected parts and recessed parts that have been formed by deforming the synthetic resin sheet, as shown in FIG. 2. The flat parts help the wafer protective sheets 1 turn flat or substantially flat when a pressure is applied to the wafers 2 and wafer protective sheets 1 housed in a container 4 in the thickness direction of the wafers 2. Thus, the wafer protective sheet can prevent the wafers 2 from being scratched more effectively. Preferably, the flat parts 7 occupy 60% or more of the total area of the front surface and rear surface of the wafer protective sheet 1.

Then, the resulting sheet having the projected parts and recessed parts is cut into a size according to the size of the wafers 2. The wafer protective sheet 1 of the present invention, shown in FIG. 1, is thus obtained. Although the size of the wafer protective sheet 1 is not necessarily the same as that of the wafers 2, it is preferable that the wafer protective sheet 1 has substantially the same size as the wafers so that a force is not locally placed on the wafers 2.

EXAMPLE

Into 100 parts by weight of each synthetic resin (high density polyethylene) shown in Table 1 was added 15 parts by weight of a polymeric antistatic agent (PELESTAT 300 produced by Sanyo Chemical Industries, Ltd.) and 1 part by weight of a black pigment. Synthetic resin compounds having flexural modulus shown in Table 1 were thus prepared. The synthetic resin compounds were each formed into a synthetic resin sheet with a thickness t shown in Table 1 by extrusion method.

The synthetic resin sheet was heated and subjected to embossing with a pair of rolls having many protrusions. The projected parts and the recessed parts were alternately formed in lattice stripes manner on the sheet. The resulting sheet was cut into wafer protective sheets 1 with a press cutting machine of 8 inches in diameter. The height h of the projected parts and recessed parts was 25 μm; the area of each projection or recess was 1.5 mm² in plan view; the density of the projected parts and recessed parts was 4 per square centimeter; and the percentage of the flat parts was about 90%.

The following properties of the resulting wafer protective sheets were evaluated.

Bending Resistance:

Average of data obtained from measurements in case that the front surface faced upward and when the rear surface faced upward.

Adhesion Prevention:

The wafer protective sheets were interposed between 8-inch wafers and stored in a container under a pressure of 5 KPa. After storage for 30 days, the wafers were taken out and observed whether the wafer protective sheets adhered to the wafers.

○: No adhesion

×: Adhering

Scratch Prevention:

Wafers and the wafer protective sheets were housed in a container under a pressure of 5 KPa in the same manner as in the evaluation of adhesion prevention, and 5 Hz vibration of 20 mm in amplitude was applied to the container in the direction along the surfaces of the wafers for 1 hour. It was observed with a microscope whether there were scratches on the wafers.

○: No scratches

Δ: Something like a scratch precursor was found.

×: A scratch was found.

Environmental Property (Disposability):

The thickness of the wafer protective sheet was evaluated as follows:

○: 110 μm or less

Δ: 110 to 130 μm

×: more than 130 μm

Handleability:

When the wafer protective sheets were taken out one by one from the top of wafer protect sheets, it was thus observed whether the wafer protective sheets left in the stack were misaligned.

○: No misalignment

×: Misaligned

TABLE 1

| | Synthetic Resin | Flexural Modulus (MPa) | Thickness (t) (μm) | Bending Resistance (mm) | Adhesion Prevention | Scratch Prevention | Environmental Property | Handleability |
|---|---|---|---|---|---|---|---|---|
| Example 1 | High-density polyethylene 1* | 1060 | 100 | 40 | ○ | ○ | ○ | ○ |
| Example 2 | High-density polyethylene 1* | 1060 | 80 | 30 | ○ | ○ | ○ | ○ |
| Example 3 | High-density polyethylene 1* | 1060 | 130 | 80 | ○ | Δ | Δ | ○ |
| Example 4 | High-density polyethylene 4* | 950 | 115 | 30 | ○ | ○ | Δ | ○ |

TABLE 1-continued

|  | Synthetic Resin | Flexural Modulus (MPa) | Thickness (t) (μm) | Bending Resistance (mm) | Adhesion Prevention | Scratch Prevention | Environmental Property | Handleability |
|---|---|---|---|---|---|---|---|---|
| Example 5 | High-density polyethylene 2* | 1260 | 80 | 65 | ◯ | Δ | ◯ | ◯ |
| Comparative Example 1 | High-density polyethylene 2* | 1260 | 70 | 55 | ◯ | Δ | ◯ | X |
| Comparative Example 2 | High-density polyethylene 3* | 730 | 150 | 40 | ◯ | ◯ | X | ◯ |
| Comparative Example 3 | High-density polyethylene 1* | 1060 | 70 | 25 | X | ◯ | ◯ | ◯ |
| Comparative Example 4 | High-density polyethylene 1* | 1060 | 150 | 70 | ◯ | Δ | X | X |
| Comparative Example 5 | High-density polyethylene 4* | 950 | 100 | 25 | X | ◯ | ◯ | ◯ |
| Comparative Example 6 | High-density polyethylene 2* | 1260 | 100 | 90 | ◯ | X | ◯ | ◯ |

High-density polyethylene 1: KF251A, produced by Japan Polyolefins Co., Ltd.
High-density polyethylene 2: 6000, produced by Tosoh Corporation
High-density polyethylene 3: AE088L, produced by Japan Polyolefins Co., Ltd.
High-density polyethylene 4: Mixture of high-density polyethylene 2 and high-density polyethylene 3 in a ratio of 1:1.

The wafer protective sheets according to the present invention were prepared from a sheet material with an appropriate thickness whose bending resistance was in an appropriate range after the projected parts and recessed parts had been formed. Consequently, the resulting wafer protective sheet exhibited good characteristics in any of adhesion prevention, scratch prevention, environment, and handling property.

On the other hand, the wafer protective sheet of Comparative Example 1 was prepared from a sheet material with thin thickness. Consequently, the wafer protective sheet easily fluttered and was difficult to handle. In order to prevent the wafer protective sheet from drooping when it was handled by an automatic machine, a hard resin was used. Accordingly, the resulting wafer protective sheet was liable to make scratches on the surfaces of wafers.

The wafer protective sheet of Comparative Example 2 used a sheet material having thick thickness, and accordingly had a problem in environment.

The wafer protective sheet of Comparative Example 3 used a sheet material having thin thickness and its bending resistance was so low that the projected parts and recessed parts of wafers could not restore to the original state when the wafers were picked up. Consequently, the wafer protective sheet remained adhering to the wafers and adhesion prevention was thus degraded.

The wafer protective sheet of Comparative Example 4 used a sheet material having thick thickness and its bending resistance was so high as to make scratches on wafers easily. Also, it was disadvantageous in terms of environment and handling.

The wafer protective sheet of Comparative Example 5 had such a low bending resistance as to result in bad adhesion as in Comparative Example 3.

The wafer protective sheet of Comparative Example 6 had such a high bending resistance that the surfaces of wafers were scratched due to the contact with the wafer protective sheet.

INDUSTRIAL APPLICABILITY

The wafer protective sheet of the present invention has a large number of projected parts and a large number of recessed parts. Since the projected parts and recessed parts are alternately arrayed in such a manner as to be positioned at intersections of lattice stripes, the stiffness of the sheet has no orientation. Since the projected parts are formed on both the front and the rear surface, the resulting sheet has no distinction between the front surface and the rear surface. Since the bending resistance of the sheet material at a thickness of 80 to 130 μm is set at 30 to 80 mm, the resulting wafer protective sheet can be easy to handle automatically, and can exhibit such a flexibility as the projected parts and recessed parts turn flat or substantially flat when a pressure is applied in the thickness direction of wafers. Thus, the wafer protective sheet has no possibility of making scratches on wafers. Since the flattened projected parts and recessed parts are restored to the original state when the container is opened, the adhesion prevention can be satisfactory.

The invention claimed is:

1. A wafer protective sheet comprising a synthetic resin sheet with a thickness of 80 to 130 μm having a large number of projected parts and a large number of recessed parts on the respective front surface and rear surface thereof, wherein:
   the large number of projected parts and the large number of recessed parts are respectively so disposed that each part is positioned at intersections of lattice stripes, and the projected part and the recessed part are disposed alternately each other;
   the sheet has such a wavy cross section that the recessed parts in the rear surface match the projected parts on the front surface;
   the sheet has flat parts oriented parallel to and between the projected parts and the recessed parts;
   the projected parts on the rear surface match the recessed parts in the front surface; and
   the wafer protective sheet has a bending resistance of 30 to 80 mm.

2. The wafer protective sheet according to claim 1, wherein the wafer protective sheet is formed of a synthetic resin compound having a flexural modulus of $1.0 \times 10^3$ to $1.2 \times 10^3$ MPa.

3. The wafer protective sheet according to claim 1, wherein the height of the projected parts and recessed parts is 20 to 50 μm.

4. The wafer protective sheet according to claim 1, wherein the density of the projected parts and recessed parts, that is, the number of projected parts per area and/or the number of recessed parts per sheet area, is 0.5 to 16 per square centimeter.

5. The wafer protective sheet according to claim 1, wherein the synthetic resin contains an antistatic agent to exhibit an antistatic property.

6. The wafer protective sheet according to claim 5, wherein the wafer protective sheet has a surface resistivity of $10^{12} \Omega$ or less.

7. The wafer protective sheet according to claim 1, wherein the flat parts occupy 60% or more of the total area of the front and rear surfaces of the wafer protective sheet.

* * * * *